United States Patent
Bulliard et al.

(10) Patent No.: US 9,997,903 B2
(45) Date of Patent: Jun. 12, 2018

(54) POWER SUPPLY DEVICE FOR PLASMA PROCESSING

(71) Applicants: Albert Bulliard, Marly (CH); Benoit Fragnière, Bulle (CH); Joël Oehen, Granges-Paccot (CH)

(72) Inventors: Albert Bulliard, Marly (CH); Benoit Fragnière, Bulle (CH); Joël Oehen, Granges-Paccot (CH)

(73) Assignee: SOLVIX GMBH (CH)

( * ) Notice: Subject to any disclaimer, the term of this patent is extended or adjusted under 35 U.S.C. 154(b) by 415 days.

(21) Appl. No.: 14/935,910

(22) Filed: Nov. 9, 2015

(65) Prior Publication Data

US 2016/0064923 A1    Mar. 3, 2016

Related U.S. Application Data

(60) Division of application No. 14/284,894, filed on May 22, 2014, now Pat. No. 9,214,801, which is a division
(Continued)

(30) Foreign Application Priority Data

Feb. 17, 2009   (EP) ..................... 09405031

(51) Int. Cl.
  *H02H 3/38*   (2006.01)
  *H01J 37/32*  (2006.01)
  (Continued)

(52) U.S. Cl.
  CPC ......... *H02H 3/38* (2013.01); *H01J 37/32045* (2013.01); *H01J 37/3444* (2013.01); *H02H 1/06* (2013.01)

(58) Field of Classification Search
  CPC ....... H02H 3/38; H02H 1/06; H01J 37/32045; H01J 37/3444
  See application file for complete search history.

(56) References Cited

U.S. PATENT DOCUMENTS

| 3,867,669 A | 2/1975 | Krasik et al. |
|---|---|---|
| 4,271,369 A | 6/1981 | Stillwagon |

(Continued)

FOREIGN PATENT DOCUMENTS

| DE | 35 38 494 | 5/1987 |
|---|---|---|
| DE | 10 2006 002 333 | 7/2007 |

(Continued)

OTHER PUBLICATIONS

European Search Report dated Jul. 3, 2009, issued in corresponding European application No. EP 09 40 5031.
(Continued)

*Primary Examiner* — Scott Bauer
(74) *Attorney, Agent, or Firm* — Ostrolenk Faber LLP

(57) ABSTRACT

A power supply device for plasma processing, wherein electric arcs may occur, comprises a power supply circuit for generating a voltage across output terminals, and a first switch connected between the power supply circuit and one of the output terminals. According to a first aspect the power supply device comprises a recovery energy circuit connected to the output terminals and to the power supply circuit. According to a second aspect the power supply device comprises an inductance circuit including an inductor and a second switch connected parallel to the inductor. According to a third aspect the power supply device comprises a controller for causing the power supply circuit and the first switch to be switched on and off. The controller is configured to determine a quenching time interval by means of a self-adaptive process. The quenching time interval defines the time interval during which, in an event of an arc, no voltage is generated across the output terminals.

9 Claims, 9 Drawing Sheets

Related U.S. Application Data of application No. 13/846,430, filed on Mar. 18, 2013, now Pat. No. 8,854,781, which is a division of application No. 12/701,813, filed on Feb. 8, 2010, now Pat. No. 8,542,471, application No. 14/935,910, which is a division of application No. 14/284,894, which is a division of application No. 13/846,505, filed on Mar. 18, 2013, now Pat. No. 8,837,100, which is a continuation of application No. 12/701,813.

(51) Int. Cl.
  *H01J 37/34* (2006.01)
  *H02H 1/06* (2006.01)

(56) References Cited

U.S. PATENT DOCUMENTS

| | | |
|---|---|---|
| 4,276,507 A | 6/1981 | Stillwagon |
| 4,299,678 A | 11/1981 | Meckel |
| 4,428,023 A | 1/1984 | Maier |
| 4,459,629 A | 7/1984 | Titus |
| 4,484,243 A | 11/1984 | Herbst et al. |
| 4,540,607 A | 9/1985 | Tsao |
| 4,557,819 A | 12/1985 | Meacham et al. |
| 4,585,986 A | 4/1986 | Dyer |
| 4,589,123 A | 5/1986 | Pearlman et al. |
| 4,740,858 A | 4/1988 | Yamaguchi et al. |
| 4,792,730 A | 12/1988 | Mintchev et al. |
| 4,870,529 A | 9/1989 | Powell et al. |
| 4,871,421 A | 10/1989 | Ogle et al. |
| 4,901,621 A | 2/1990 | Tidman |
| 4,936,960 A | 6/1990 | Siefkes et al. |
| 4,999,760 A | 3/1991 | Tietema |
| 5,192,894 A | 3/1993 | Teschner |
| 5,241,152 A | 8/1993 | Anderson et al. |
| 5,275,083 A | 1/1994 | Hawke et al. |
| 5,281,321 A | 1/1994 | Sturmer et al. |
| 5,286,360 A | 2/1994 | Szczyrbowski |
| 5,303,139 A | 4/1994 | Mark |
| 5,307,004 A | 4/1994 | Carsten |
| 5,377,218 A | 12/1994 | Guenther |
| 5,415,757 A | 5/1995 | Szczyrbowski et al. |
| 5,418,707 A | 5/1995 | Shimer et al. |
| 5,427,669 A | 6/1995 | Drummond |
| 5,488,535 A | 1/1996 | Masghati et al. |
| 5,517,085 A | 5/1996 | Engemann et al. |
| 5,535,906 A | 7/1996 | Drummond |
| 5,573,596 A | 11/1996 | Yin |
| 5,576,939 A | 11/1996 | Drummond |
| 5,584,972 A | 12/1996 | Lantsman |
| 5,584,974 A | 12/1996 | Sellers |
| 5,611,899 A | 3/1997 | Maass .................... 204/298.08 |
| 5,616,224 A | 4/1997 | Boling |
| 5,645,698 A | 7/1997 | Okano |
| 5,651,865 A | 7/1997 | Sellers |
| 5,682,067 A | 10/1997 | Manley et al. |
| 5,698,082 A | 12/1997 | Teschner et al. |
| 5,708,250 A | 1/1998 | Benjamin et al. |
| 5,718,813 A | 2/1998 | Drummond et al. |
| 5,725,675 A | 3/1998 | Fong et al. |
| 5,731,565 A | 3/1998 | Gates |
| 5,750,971 A | 5/1998 | Taylor |
| 5,814,195 A | 9/1998 | Lehan et al. |
| 5,815,388 A | 9/1998 | Manley et al. |
| 5,851,365 A | 12/1998 | Scobey |
| 5,855,745 A | 1/1999 | Manley |
| 5,864,471 A | 1/1999 | Kammiller .................... 363/17 |
| 5,882,492 A | 3/1999 | Manley et al. |
| 5,889,391 A | 3/1999 | Coleman |
| 5,917,286 A | 6/1999 | Scholl et al. |
| 6,001,224 A | 12/1999 | Drummond |
| 6,005,218 A | 12/1999 | Walde et al. |
| 6,024,844 A | 2/2000 | Drummond et al. |
| 6,046,641 A | 4/2000 | Chawla |
| 6,080,292 A | 6/2000 | Matsuzawa et al. |
| 6,135,998 A | 10/2000 | Palanker |
| 6,161,332 A | 12/2000 | Avot |
| 6,162,332 A | 12/2000 | Chiu |
| 6,174,450 B1 | 1/2001 | Patrick et al. |
| 6,176,979 B1 | 1/2001 | Signer et al. |
| 6,217,717 B1 | 4/2001 | Drummond et al. |
| 6,222,321 B1 | 4/2001 | Scholl et al. |
| 6,238,513 B1 | 5/2001 | Arnold et al. |
| 6,258,219 B1 | 7/2001 | Mueller |
| 6,321,531 B1 | 11/2001 | Caren et al. |
| 6,332,961 B1 | 12/2001 | Johnson et al. |
| 6,365,009 B1 | 4/2002 | Ishibashi |
| 6,416,638 B1 | 7/2002 | Kuriyama et al. |
| 6,433,987 B1 | 8/2002 | Liptak |
| 6,437,963 B1 | 8/2002 | Hamilton et al. ............ 361/227 |
| 6,440,281 B1 | 8/2002 | Sturmer |
| 6,447,655 B2 | 9/2002 | Lantsman |
| 6,447,719 B1 | 9/2002 | Agoamohamadi et al. |
| 6,472,822 B1 | 10/2002 | Chen et al. |
| 6,484,707 B1 | 11/2002 | Frus et al. |
| 6,507,155 B1 | 1/2003 | Barnes et al. |
| 6,521,099 B1 | 2/2003 | Drummond et al. |
| 6,522,076 B2 | 2/2003 | Goedicke et al. |
| 6,524,455 B1 | 2/2003 | Sellers |
| 6,552,295 B2 | 4/2003 | Markunas et al. |
| 6,577,479 B1 | 6/2003 | Springer et al. |
| 6,621,674 B1 | 9/2003 | Zahringer et al. |
| 6,636,545 B2 | 10/2003 | Krasnov |
| 6,708,645 B1 | 3/2004 | Choquette |
| 6,736,944 B2 | 5/2004 | Buda |
| 6,740,207 B2 | 5/2004 | Kloeppel et al. |
| 6,753,499 B1 | 6/2004 | Yasaka et al. |
| 6,808,607 B2 | 10/2004 | Christie |
| 6,817,388 B2 | 11/2004 | Tsangaris |
| 6,876,205 B2 | 4/2005 | Walde et al. |
| 6,878,248 B2 | 4/2005 | Signer et al. |
| 6,879,870 B2 | 4/2005 | Shannon et al. |
| 6,894,245 B2 | 5/2005 | Hoffman et al. |
| 6,943,317 B1 | 9/2005 | Ilic et al. |
| 6,967,305 B2 | 11/2005 | Sellers |
| 6,974,550 B2 | 12/2005 | Benjamin et al. |
| 7,015,703 B2 | 3/2006 | Hopkins et al. |
| 7,026,174 B2 | 4/2006 | Fischer |
| 7,030,335 B2 | 4/2006 | Hoffman et al. |
| 7,081,598 B2 | 7/2006 | Ilic et al. |
| 7,086,347 B2 | 8/2006 | Howald et al. |
| 7,095,179 B2 | 8/2006 | Chistyakov |
| 7,132,618 B2 | 11/2006 | Hoffman et al. |
| 7,169,256 B2 | 1/2007 | Dhindsa et al. |
| 7,179,987 B2 | 2/2007 | Farth et al. |
| 7,247,218 B2 | 7/2007 | Hoffman |
| 7,247,221 B2 | 7/2007 | Stowell, Jr. |
| 7,261,797 B2 | 8/2007 | Sellers |
| 7,265,619 B2 | 9/2007 | Tayrani |
| 7,292,045 B2 | 11/2007 | Anwar et al. |
| 7,305,311 B2 | 12/2007 | van Zyl |
| 7,445,695 B2 | 11/2008 | Ilic et al. ................ 204/192.12 |
| 7,471,047 B2 | 12/2008 | Ogawa |
| 7,498,908 B2 | 3/2009 | Gurov |
| 7,503,996 B2 | 3/2009 | Chen et al. |
| 7,514,377 B2 | 4/2009 | Sato et al. |
| 7,514,935 B2 | 4/2009 | Pankratz |
| 7,531,070 B2 | 5/2009 | Kuriyama et al. |
| 7,553,679 B2 | 6/2009 | Hoffman |
| 7,567,037 B2 | 7/2009 | Setsuhara et al. |
| 7,651,492 B2 | 1/2010 | Wham |
| 7,761,247 B2 | 7/2010 | van Zyl |
| 7,929,261 B2* | 4/2011 | Wiedemuth ...... H01J 37/32935 204/192.13 |
| 8,044,594 B2 | 10/2011 | Morgan et al. |
| 8,217,299 B2 | 7/2012 | Ilic et al. |
| 8,395,078 B2 | 3/2013 | Ilic |
| 8,735,767 B2* | 5/2014 | Nitschke ........... H01J 37/32935 219/121.36 |
| 2001/0047933 A1 | 12/2001 | Lantsman |
| 2002/0104753 A1 | 8/2002 | Kloeppel et al. |
| 2002/0108933 A1 | 8/2002 | Hoffman et al. |

(56) References Cited

U.S. PATENT DOCUMENTS

| | | |
|---|---|---|
| 2002/0170678 A1 | 11/2002 | Hayashi et al. |
| 2003/0136766 A1 | 7/2003 | Hoffman et al. |
| 2003/0146083 A1 | 8/2003 | Sellers |
| 2003/0192475 A1 | 10/2003 | Shannon et al. |
| 2003/0205460 A1 | 11/2003 | Buda |
| 2003/0205557 A1 | 11/2003 | Benjamin et al. |
| 2004/0026235 A1 | 2/2004 | Stowell, Jr. |
| 2004/0027209 A1 | 2/2004 | Chen et al. |
| 2004/0055881 A1 | 3/2004 | Christie |
| 2004/0124077 A1 | 7/2004 | Christie ............ 204/192.12 |
| 2004/0149699 A1 | 8/2004 | Hofman et al. |
| 2004/0182696 A1 | 9/2004 | Kuriyama et al. |
| 2004/0182697 A1 | 9/2004 | Buda |
| 2004/0191950 A1 | 9/2004 | Nakamura et al. |
| 2004/0226657 A1 | 11/2004 | Hoffman |
| 2004/0245999 A1 | 12/2004 | Walde et al. |
| 2004/0252527 A1 | 12/2004 | Serge ........................ 363/20 |
| 2005/0035770 A1 | 2/2005 | Hopkins et al. |
| 2005/0040144 A1 | 2/2005 | Sellers |
| 2005/0092596 A1 | 5/2005 | Kouznetsov |
| 2005/0167262 A1 | 8/2005 | Sellers |
| 2005/0236377 A1 | 10/2005 | Hoffman et al. |
| 2005/0258148 A1 | 11/2005 | Condrashoff |
| 2005/0264218 A1 | 12/2005 | Dhindsa et al. |
| 2006/0011591 A1 | 1/2006 | Sellers |
| 2006/0049831 A1 | 3/2006 | Anwar et al. |
| 2006/0054601 A1 | 3/2006 | Ilic et al. |
| 2006/0057854 A1 | 3/2006 | Setsuhara et al. |
| 2006/0066248 A1 | 3/2006 | Chistyakov |
| 2006/0076904 A1 | 4/2006 | Wiedemuth et al. ........ 315/291 |
| 2006/0189168 A1 | 8/2006 | Sato et al. |
| 2006/0213761 A1 | 9/2006 | Axenback et al. |
| 2006/0214599 A1 | 9/2006 | Ogawa |
| 2006/0241879 A1 | 10/2006 | van Zyl |
| 2006/0252283 A1 | 11/2006 | Takeda et al. |
| 2006/0278608 A1 | 12/2006 | Hoffman |
| 2007/0008034 A1 | 1/2007 | Tayrani |
| 2007/0042131 A1 | 2/2007 | Soo et al. |
| 2007/0073498 A1 | 3/2007 | Winterhalter et al. ......... 702/64 |
| 2007/0080903 A1 | 4/2007 | Lee |
| 2007/0139122 A1 | 6/2007 | Nagarkatti et al. |
| 2008/0061794 A1 | 3/2008 | Pankratz |
| 2008/0067433 A1 | 3/2008 | Weiguo et al. .......... 250/492.21 |
| 2008/0121625 A1* | 5/2008 | Zaehringer ....... H01J 37/32935 219/121.54 |
| 2008/0122369 A1 | 5/2008 | Nitschke |
| 2008/0156632 A1 | 7/2008 | van Zyl |
| 2008/0203070 A1 | 8/2008 | Ilic et al. |
| 2008/0216745 A1 | 9/2008 | Wiedemuth et al. ..... 118/723 R |
| 2008/0218923 A1 | 9/2008 | Wiedemuth et al. ........... 361/94 |
| 2008/0309402 A1 | 12/2008 | Ozimek et al. |
| 2010/0026186 A1 | 2/2010 | Forrest et al. |
| 2010/0213903 A1 | 8/2010 | Ozimek et al. |
| 2012/0187844 A1 | 7/2012 | Hoffman et al. |

FOREIGN PATENT DOCUMENTS

| | | |
|---|---|---|
| EP | 213689 | 3/1987 |
| EP | 0564789 A1 | 2/1993 |
| EP | 1 434 336 A | 6/2004 |
| EP | 1 995 818 A | 11/2008 |
| JP | 11-323543 | 11/1999 |
| JP | 2004-225100 | 8/2004 |
| WO | WO 01/13402 A | 2/2001 |
| WO | WO 2005/010228 A | 2/2005 |
| WO | WO2006014212 A2 | 2/2006 |
| WO | WO2006023847 A1 | 3/2006 |
| WO | WO2008033968 A2 | 3/2008 |
| WO | WO 2008/138573 | 11/2008 |

OTHER PUBLICATIONS

Massimo, "European Search Report re Application Matter EP 07 81 4831", dated Oct. 17, 2012, Published in: EP.

Harriston, William, "Office Action re U.S. Appl. No. 12/631,735", dated Jun. 26, 2012, p. 44 Published in: US.

Korean Intellectual Property Office, "Notice of Request for Submission of Argument; Office Action re Korean application No. 10-2009-7018460", dated Feb. 15, 2012, p. 7, Published in: KR.

Korean Intellectual Property Office, "Notice of Request for Submission of Argument; Office Action re Korean application No. 10-2007-7024782", dated Feb. 29, 2012, p. 7 Published in: KR.

Burke, Julie, "International Search report and Written Opinion re Application PCT/US07/78339", dated Aug. 29, 2008, Published in: US.

Young, Lee W., "PCT International Search Report re Application No. PCT/US08/054056", dated Jun. 25, 2008, Published in: PCT.

Kim, Ki Wan, "International Search Report and Written Opinion re Application PCT/US09/051174", dated Feb. 24, 2010, Published in: KR.

Baharlou, Simin, "International Preliminary Report on Patentability re application No. PCT/US09/051174", dated Feb. 10, 2011, Published in: WO.

Kolev, V., "International Search Report re Application PCT/US09/066899", dated Feb. 19, 2010, Published in: AU.

Mulhausen, D., "International Preliminary Report on Patentability re Application PCT/US09/066899", dated Jun. 16, 2011, Published in: CH.

Raj, M., "International Search Report and Written Opinion re Application No. PCT/US2011/047464", dated Oct. 3, 2012, Published in: AU.

O'Dowd, Sean, "Response to Office Action re U.S. Appl. No. 12/631,735", dated Sep. 26, 2012, p. 9 Published in: US.

Baharlou, Simin, "International Preliminary Report on Patentability re Application No. PCT/US2011/047464", dated Mar. 7, 2013, p. 6 Published in: CH.

* cited by examiner

POWER SUPPLY DEVICE FOR PLASMA PROCESSING

CROSS REFERENCE TO RELATED APPLICATIONS

The present application is a divisional under 37 C.F.R. § 1.53(b) of prior U.S. patent application Ser. No. 14/284,894, filed May 22, 2014, by Albert Bulliard et al., entitled POWER SUPPLY DEVICE FOR PLASMA PROCESSING, which in turn is a divisional of prior U.S. patent application Ser. No. 13/846,430, filed Mar. 18, 2013 (now U.S. Pat. No. 8,854,781, issued Oct. 7, 2014), which in turn is a divisional of U.S. patent application Ser. No. 12/701,813, filed Feb. 8, 2010 (now U.S. Pat. No. 8,542,471, issued Sep. 24, 2013), which in turn claims priority of European Patent Application No. 09405031.7, filed Feb. 17, 2009, the contents of which are incorporated in full by reference herein.

The present application is a divisional under 37 C.F.R. § 1.53(b) of prior U.S. patent application Ser. No. 14/284,894, filed May 22, 2014, by Albert Bulliard et al., entitled POWER SUPPLY DEVICE FOR PLASMA PROCESSING, which in turn is a divisional of prior U.S. patent application Ser. No. 13/846,505, filed Mar. 18, 2013 (now U.S. Pat. No. 8,837,100, issued Sep. 16, 2014), which in turn is a continuation of U.S. patent application Ser. No. 12/701,813, filed Feb. 8, 2010 (now U.S. Pat. No. 8,542,471, issued Sep. 24, 2013), which in turn claims priority of European Patent Application No. 09405031.7, filed Feb. 17, 2009, the contents of which are incorporated in full by reference herein.

FIELD OF THE INVENTION

The invention concerns a power supply device for plasma processing.

BACKGROUND OF THE INVENTION

There are variety of processes in which a plasma is generated to deposit and/or to remove material. Examples are the process of sputtering, where material is removed from a target and deposited on a substrate in order to produce e.g. a thin film, or the process of etching, where atoms are removed in order to create e.g. a very clean surface.

To produce the plasma, a high voltage is generated between electrodes by means of a suitable power supply device. However, the processing conditions may be such that there is a sudden electrical discharge for instance between the electrodes which causes the occurrence of one or more arcs. Normally, such arc events are to be prevented since they may lead e.g. to damages in the target or to a poor quality of the surface to be processed.

It is widely known to use a switch for interrupting the power supply to the electrodes when an arc event occurs (see e.g. U.S. Pat. No. 5,192,894 or U.S. Pat. No. 6,621,674 B1). However, interruption of the power supply gives rise to the problem that the energy which is stored e.g. in the cables at the time of interruption is supplied to the plasma, which may impede a quick quenching of the arc. Eventually, the duration until the plasma processing is in an arc-free condition and operates normally may be prolonged.

The patent application US 2004/124077 A1 refers to a power supply which is suitable in the field of so-called HiPIMS ("High Power Impulse Magnetron Sputtering"). The power supply, which produces very short pulses of extremely high power, is provided with a capacitor that is repetitively charged and then discharged through an inductor. When an arc is detected, the capacitor is first disconnected from the inductor by actuating a first switch and then connected to the inductor again by actuating two other switches such that the energy contained in the inductor is recycled to the capacitor. Compared to this recycled energy, the energy contained in any cables connecting the output terminals of the power supply with the plasma processing chamber is negligible. Thus, no measures are provided to recover this energy in the cables.

In the patent application US 2008/309402 A1, it is proposed to use a pre-charging/discharging circuit for pre-charging a capacitor under normal operating conditions. When an arc is detected, an amount of the residual energy which is stored in the cables leading to the plasma processing chamber is transferred into the capacitor and finally eliminated by means of the pre-charging/discharging circuit before the power is applied again to the plasma processing chamber. Thus, the energy is finally lost, which makes the operation inefficient.

Apart from the problem of the energy in the cables, another problem impeding an efficient handling of arcs may arise when the time of interruption of the power supply is not optimal, e.g. the time is too short to quench an arc.

In the U.S. Pat. No. 6,621,674 B1, it is proposed to adjust the time interval during which the voltage is applied to the electrodes in an adaptive manner, whereas the time interval during which the voltage is disconnected is kept constant.

SUMMARY OF THE INVENTION

One object of the present invention is to provide a power supply device for plasma processing which allows the handling of arc events in a more efficient way.

According to a first aspect of the invention this object is achieved with a power supply device comprising a recovery energy circuit for feeding at least partially the energy back which is stored in the conductors when the power supply to the plasma processing chamber is interrupted. The power supply circuit is configured to reuse the energy fed back at least partially for the power supplied to the plasma processing chamber.

According to a second aspect of the invention there is provided a power supply device comprising a first switch and an inductance circuit that comprises an inductor and a second switch. The first switch is arranged outside of the inductance circuit and the second switch is connected parallel to the inductor.

According to a third aspect of the invention there is provided a power supply device comprising a controller being configured to determine a quenching time interval by means of a self-adaptive process. The quenching time interval defines the time interval during which, in an event of an arc, no voltage is generated across the output terminals of the power supply device.

Each of the three aspects has the advantage that arcs which occur in the plasma processing chamber can be handled in a more efficient way.

BRIEF DESCRIPTION OF THE DRAWINGS

The subject invention will now be described in terms of its preferred embodiments. These embodiments are set forth to aid the understanding of the invention, but are not to be construed as limiting.

DETAILED DESCRIPTION OF THE PREFERRED EMBODIMENTS

Figure 1:
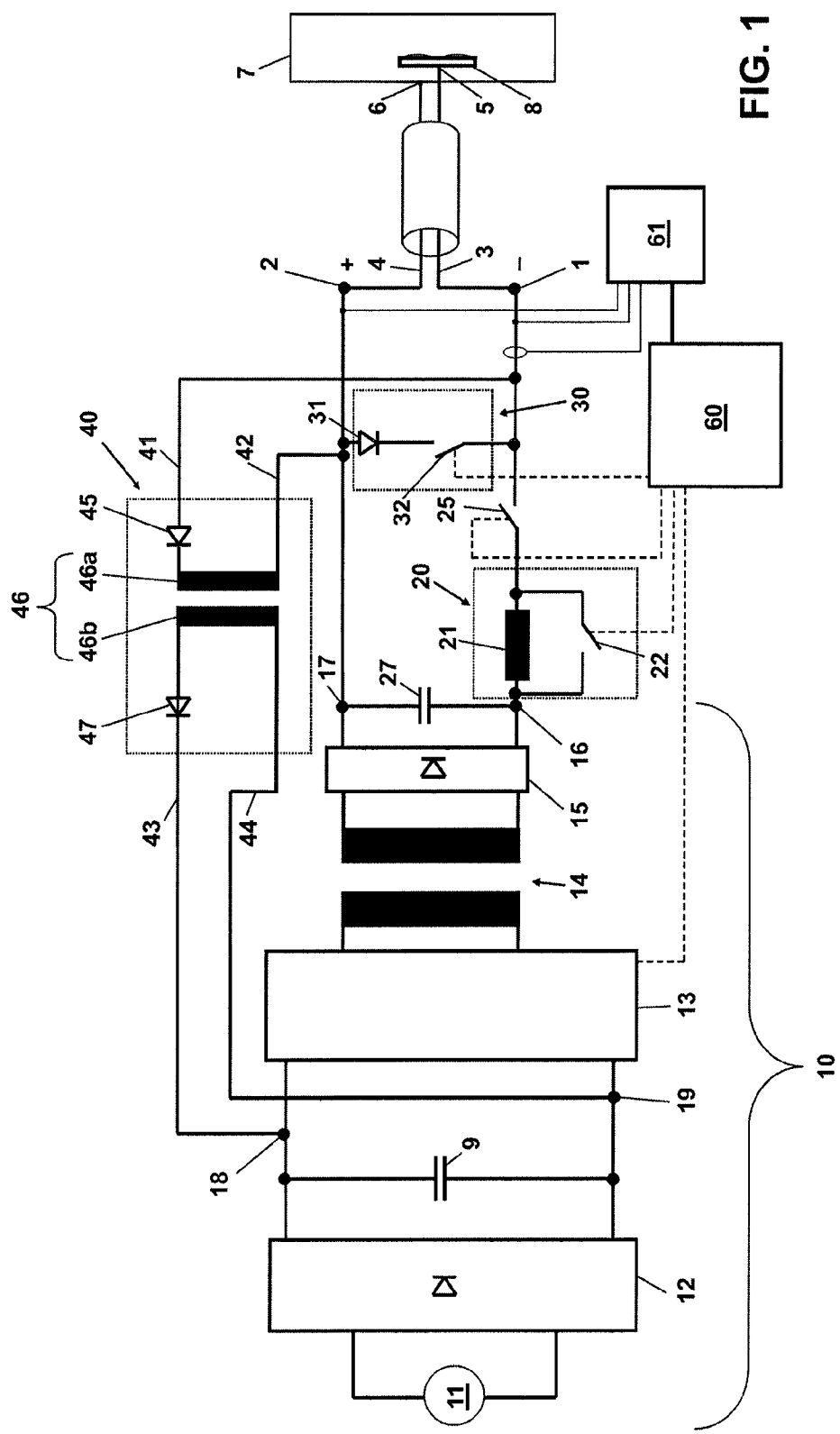
FIG. 1 shows an embodiment of a plasma processing installation including a power supply device according to the invention.

FIG. 1 shows a plasma processing installation including a power supply device having output terminals 1 and 2, which are connected to a plasma processing chamber 7 by means of a pair of wires 3, 4 forming e.g. a cable. The output terminals 1, 2 are normally located outside of the housing of the power supply. The processing chamber 7 is designed to produce a plasma therein for accomplishing the desired process such as deposition or etching of a material. Electrodes 5 and 6 are located at the end of the wires 3, 4. The negative electrode 5 ("cathode") is connected to a target 8 located inside the processing chamber 7. The positive electrode 6 ("anode") is connected e.g. to the housing of the processing chamber 7 or to an internal electrode. During the processing operation a voltage U is developed across the electrodes 5 and 6. As the case may be, there is also a substrate (not shown) located inside the processing chamber 7.

The power supply device comprises a power supply circuit 10 to produce a DC voltage across the terminals 16 and 17. In the embodiment shown in FIG. 1 the power supply circuit 10 comprises an AC input 11, which is e.g. connected to the power supply network, a first rectifier 12, a switching circuit 13, a transformer 14 and a second rectifier 15. The switching circuit 13 includes e.g. a H-bridge with switches which are controlled by a controller 60.

The first terminal 16 of the power supply circuit 10 is connected via an inductor 21 and a serial switch 25 to the negative output terminal 1. The switch 25 is e.g. a transistor such as an IGBT and is controlled by the controller 60.

The second terminal 17 is connected to the positive output terminal 2 and via a capacitor 27 to the first terminal 16. The inductor 21 limits the temporal variation of the current, dI/dt, during an arc event (see the moderate slope of curve 71 in FIG. 7 in the time interval $t_1$-$t_2$). The capacitor 27 serves for storing energy.

A switch 22 is arranged parallel to the inductor 21. The switch 22 is e.g. a transistor, such as an IGBT or a power MOSFET and is controlled by the controller 60.

Figure 2:
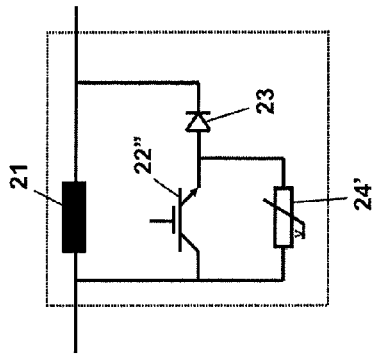
FIGS. 2 to 5 show various embodiments of the inductance circuit of the power supply device of FIG. 1.

FIG. 2 shows an example of a switch 22 being composed of a power MOSFET 22' having a serial diode 23, which serves as a freewheeling diode.

Figure 3:
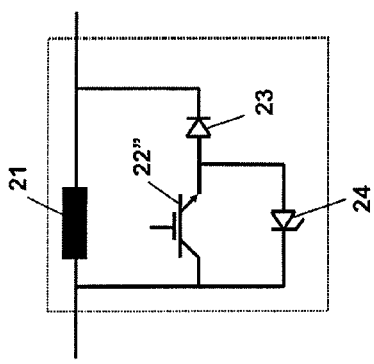
Figure 4:
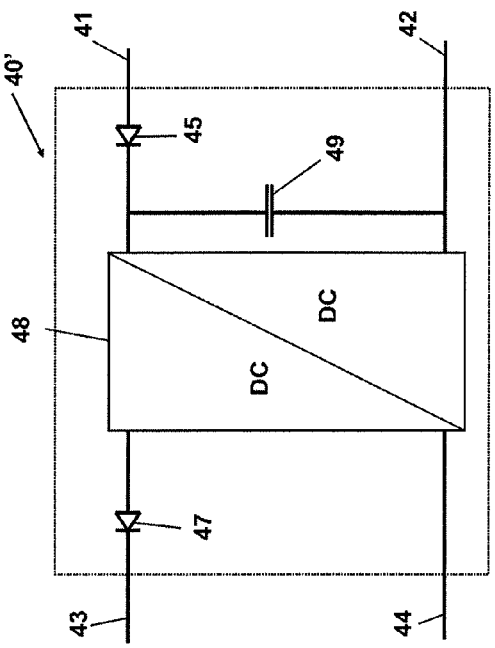
Figure 5:
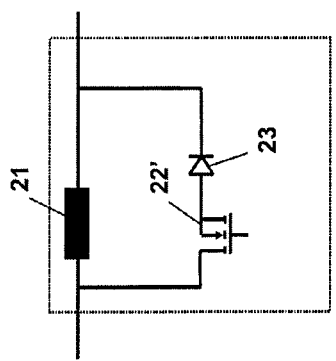

In case that the switch 22 is an IGBT 22" as shown in FIGS. 3 to 5, there is preferably provided an overvoltage protection in form of a component which is connected parallel to the switch 22. This component may be e.g. a voltage suppressor, such as a Zener diode 24 as shown in FIG. 3 or a TVSS (Transient Voltage Surge Suppressor) 24' as shown in FIG. 4, a power resistor 24" as shown in FIG. 5, or any other suitable means for protecting the switch 22 against an overvoltage.

In case that the switch 22 is an avalanche rated power MOSFET, it has an inherent overvoltage protection.

An overvoltage may e.g. occur in the case that the plasma does not re-ignite after the switch 25 has been closed again and the switch 22 is opening after an arc event, so that the voltage across the inductor 21 is increased, or in the case that—due to a malfunction—the switch 25 is opening when the switch 22 is opened.

In the embodiment shown in FIG. 1, the components 21, 22 form an inductance circuit 20 which is arranged between the terminals 16 and 1 and is thus integrated in the negative branch of the circuit. Alternatively, the inductance circuit 20 can be integrated in the positive branch by arranging it between the terminals 17 and 2 or it is conceivable to provide each branch with an inductance circuit 20.

The power supply device shown in FIG. 1 further comprises a plasma floating potential neutralizing circuit 30 (in the following denoted by "PFPN circuit") connected to the negative terminal 1 and the positive terminal 2 and an energy recovery circuit 40 arranged between the output terminals 1, 2 and the power supply circuit 10.

The PFPN circuit 30 comprises a diode 31 and a switch 32. The switch 32 is e.g. a transistor such as an IGBT and is controlled by the controller 60.

The energy recovery circuit 40 comprises a first line 41 which connects the negative output terminal 1 via a diode 45 to the primary winding 46a of a transformer 46, a second line 42 which connects the positive output terminal 2 to the primary winding 46a of the transformer 46, a third line 43 which connects the secondary winding 46b of the transformer 46 via a diode 47 to a first input terminal 18 of the power supply circuit 10, and a fourth line 44 which connects the secondary winding 46b of the transformer 46 to a second input terminal 19 of the power supply circuit 10.

The power supply circuit 10 comprises a capacitor 9, which is connected to the first input terminal 18 and the second input terminal 19. Thus, the power supply circuit 10 is suitable to reuse the energy which is fed back via the energy recovery circuit 40 at least partially for the power supplied to the plasma processing chamber 7.

Figure 6:
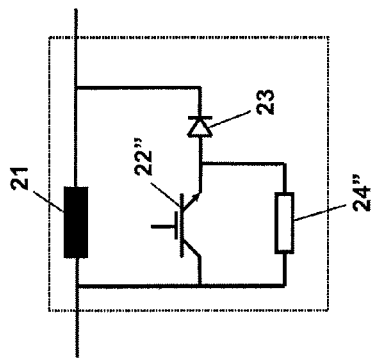
FIG. 6 shows an alternative embodiment of the energy recovery circuit of the power supply device of FIG. 1.

In an alternative embodiment the energy recovery circuit 40' is designed as shown in FIG. 6 by providing a DC-DC converter 48 whose input is connected to the lines 41, 42 and whose output is connected to the lines 43, 44, and a capacitor 49 which is connected to the input of the DC-DC converter 48.

The power supply device shown in FIG. 1 further comprises an arc detection circuit 61 for detecting the occurrence of an arc condition and for generating an arc detection signal which is processed by the controller 60. The arc detection circuit 61 measures e.g. the current through the negative or positive branch and the voltage across the two output terminals 1, 2.

In the following the operation of the power device is explained in more detail. In the event that an arc occurs, the controller 60 controls the switches 22, 25, and 32 to activate the circuits 20, 30, and 40 such that the arc is suppressed and/or quenched and the normal operation mode is recovered in an efficient way.

In the following, successive instances of time t are referred to as $t_0$, $t_1$, $t_2$, etc. The following table summarizes the successive states of the switches 22, 25, and 32, where "OFF" means that the switch is open and "ON" means that the switch is closed. For some of time intervals the switches 22 and 32 may be either ON or OFF (denoted in the table by "or"). In case of transistors, a switch 22, 25, or 32 is "ON", when it is in the conducting state, and "OFF", when it is in the non-conducting state.

| time interval | switch 22 of circuit 20 | serial switch 25 | switch 32 of circuit 30 |
|---|---|---|---|
| $t_0$-$t_1$ | ON or OFF | ON | OFF |
| $t_1$-$t_2$ | ON or OFF | ON | OFF |
| $t_2$-$t_3$ | ON | OFF | OFF |
| $t_3$-$t_4$ | ON | OFF | OFF or ON |
| $t_4$-$t_5$ | ON | OFF | ON |
| $t_5$-$t_6$ | ON | OFF | OFF |
| $t_6$-$t_7$ | ON | ON | OFF |
| $t_7$-$t_8$ | OFF | ON | OFF |
| $t_8$-$t_9$ | OFF | ON | OFF |
| $t_9$-$t_{10}$ | ON or OFF | ON | OFF |

By actuating the switches 22, 25, 32, the voltage U between the target 8 and the positive electrode 6 and the current I passing through the electrodes 5 and 6 change in time.

Figure 7:
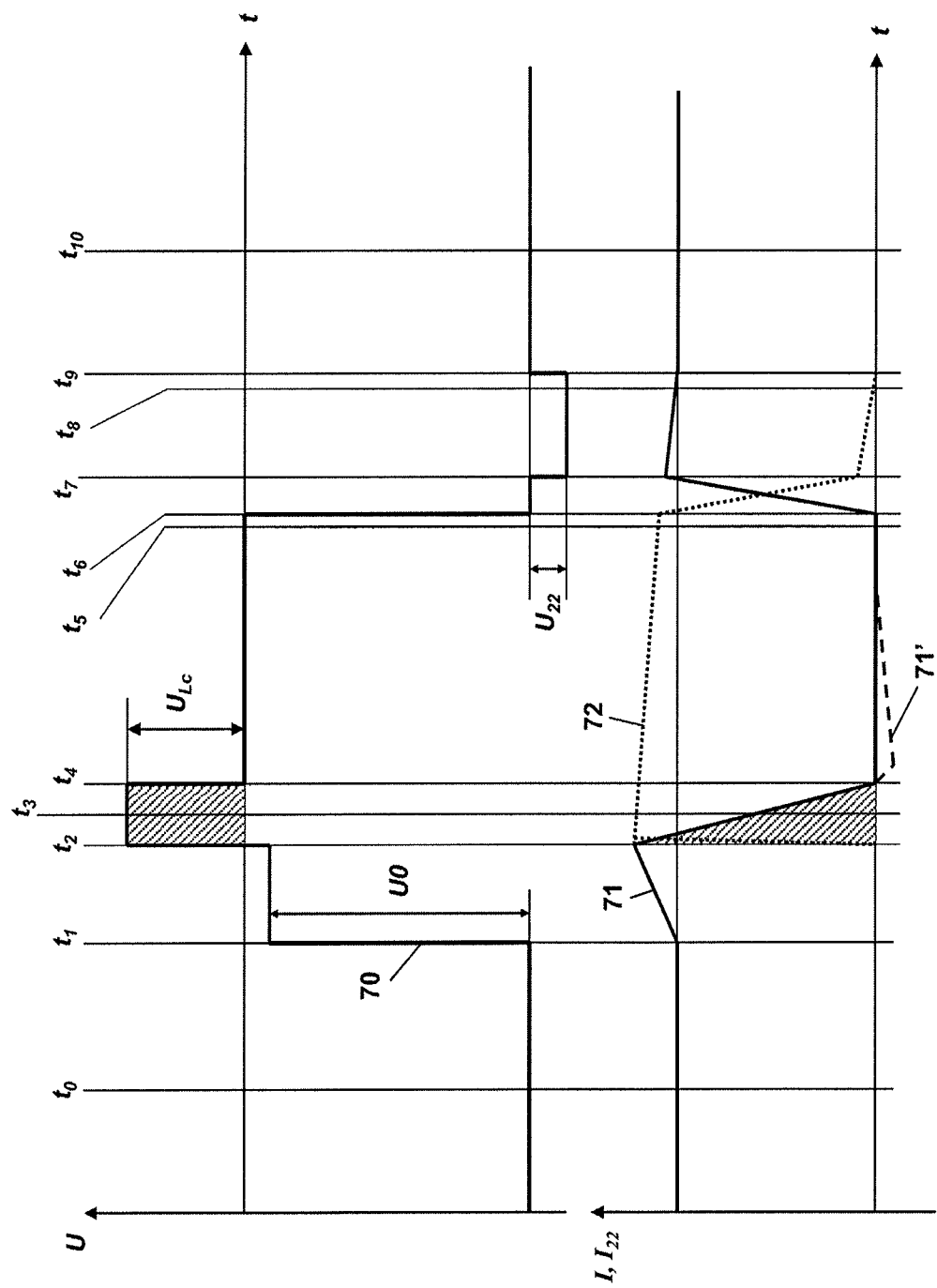
FIG. 7 shows the temporal development of U, I and $I_{22}$, where U is the voltage between the electrodes, I the current passing through the electrodes, and $I_{22}$ the current passing through the branch parallel to the inductor of the power supply device of FIG. 1.

FIG. 7 shows an example of the temporal development of the voltage U (solid curve 70) and the temporal development of the current I (solid curve 71), when an arc event occurs. The dotted line 72 indicates the temporal development of the current $I_{22}$ flowing through the parallel branch 22 of the inductance circuit 20.

Figure 8:
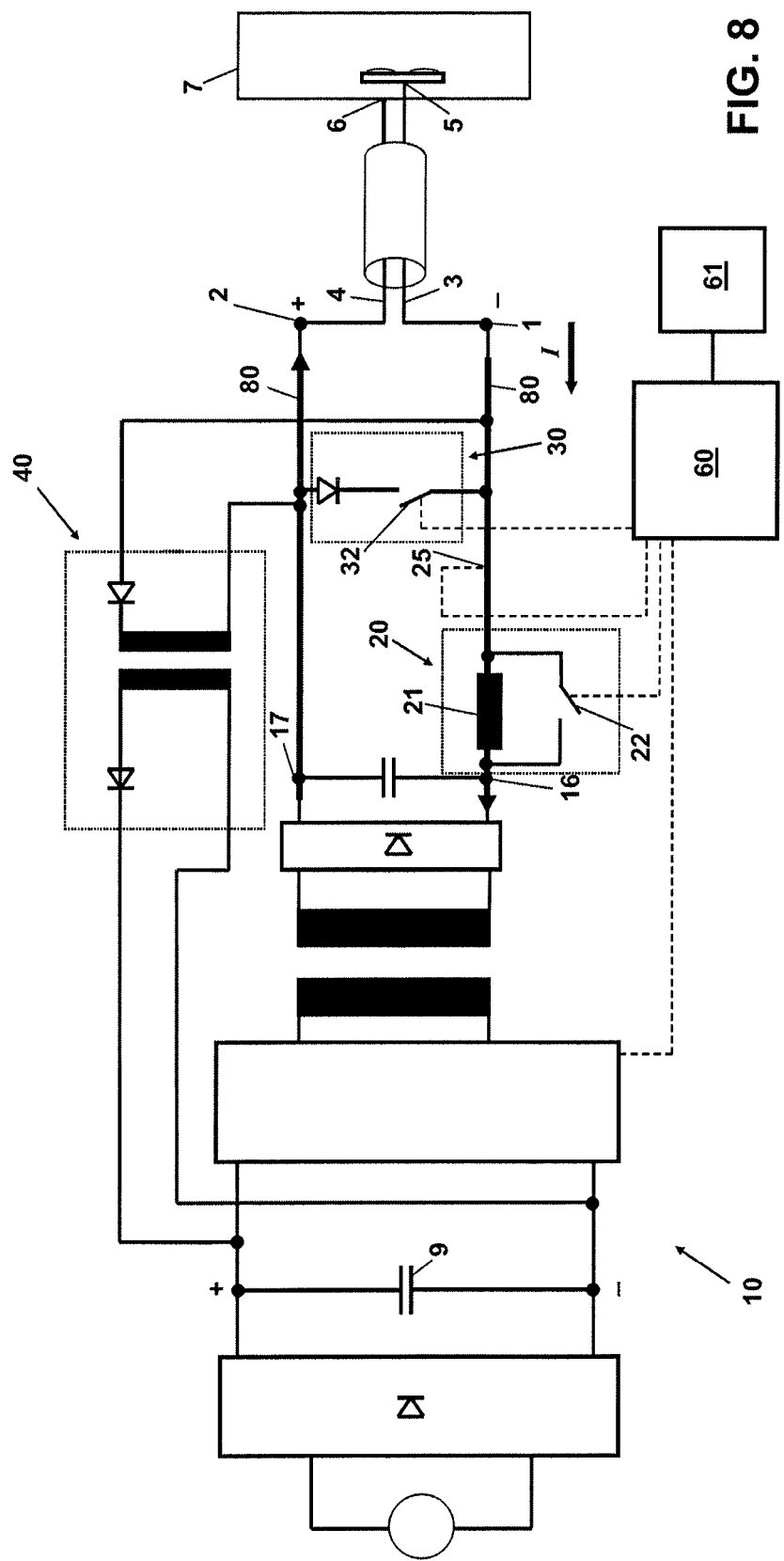
FIG. 8 shows schematically the state of the installation of FIG. 1 in a first time interval $t_0$-$t_2$.

At time t0 the plasma processing is in the normal operation mode, where material in the processing chamber 7 is deposited or etched according to the setup of the plasma processing installation. The voltage U has a value which is in the present example negative. The switch 22 is open or closed, the switch 32 is open, and the switch 25 is closed. Thus, there is a current flowing from the terminal 17 through the wire 4 and the plasma in the processing chamber 7 back to the terminal 16 via the wire 3. This is schematically shown in FIG. 8, where the direction of this current is indicated by the arrows 80.

At time $t_1$ an electric arc occurs in the processing chamber 7, which has the effect that the voltage U tends to zero, whereas the current I increases (see the curves 70 and 71 between the two instants of time $t_1$ and $t_2$ in FIG. 7). The inductor 21 limits the temporal variation of I, so that the slope dI/dt is moderate. The change of voltage, U0, may be e.g. in the range of several tens V to several hundreds V.

Figure 9:
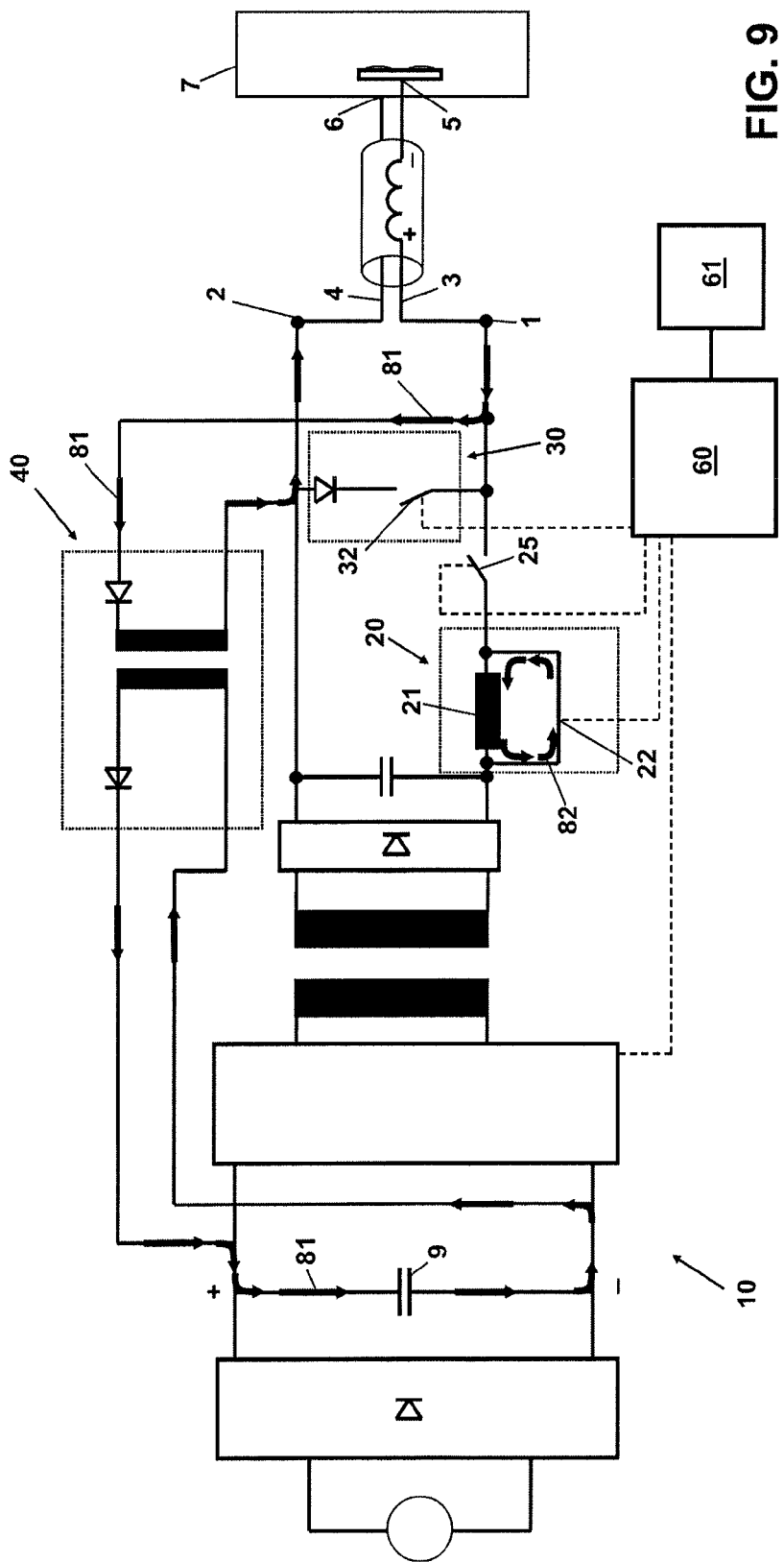
FIG. 9 shows schematically the state of the installation of FIG. 1 in a second time interval $t_2$-$t_4$.

At time $t_2$ the arc detection circuit 61 detects the arc occurrence in the processing chamber 7 and produces an arc detection signal causing the controller 60 to close the switch 22 and to open the switch 25. The energy in the wires 3, 4 at the time $t_2$ is approximately given by $L_c \cdot I^2/2$, where $L_c$ is the inductance of the wires 3, 4. The current originating from the energy in the wires 3, 4 begins to flow via the energy recovery circuit 40 to the power supply circuit 10, where it is stored in the capacitor 9. This is schematically shown in FIG. 9, where the direction of this current is indicated by the arrows 81. At the same time the current stored in the inductor 21 flows through the switch 22 as indicated by arrows 82 in FIG. 9.

Referring back to FIG. 7, it can be seen that at time $t_2$ the voltage U changes its polarity and reaches a certain level $U_{Lc}$ due to the energy in the wires 3, 4. The level $U_{Lc}$ corresponds to the voltage between the lines 41 and 42 and defines the decay time i of the current I, which is given by $\tau = L_C \cdot I/U_{Lc}$.

As can be seen from FIG. 7, the voltage U remains substantially at the level $U_{Lc}$ in the time interval $t_2$-$t_4$, whereas the current I tends to zero. $t_3$ indicates the instant of time, when the switch 32 is closed. $t_4$ indicates the instant of time, when the recovery of the energy from the wires 3,4 is finished. It is conceivable to predefine $t_3$ such that the switch 32 is closed before or after $t_4$.

Figure 10:
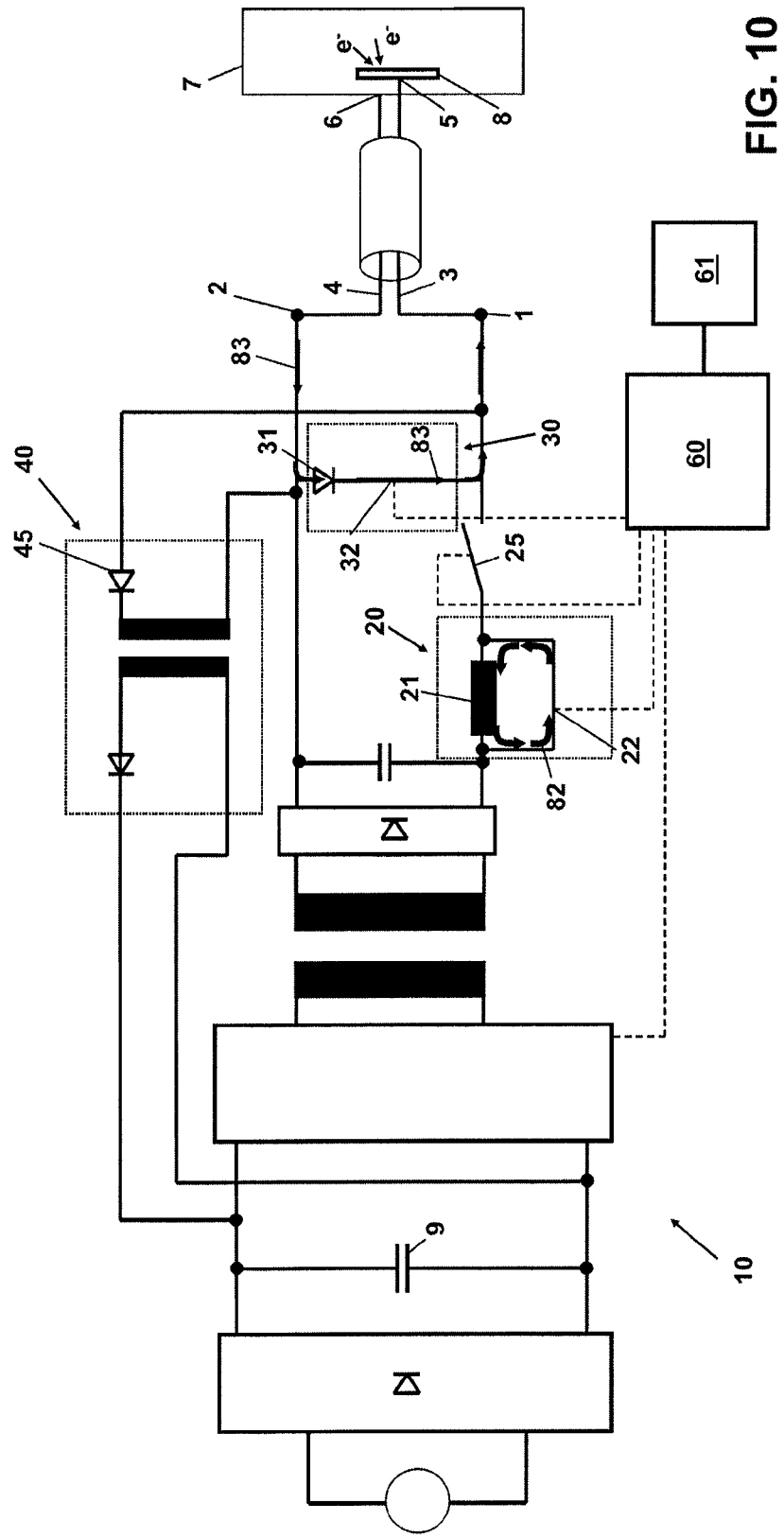
FIG. 10 shows schematically the state of the installation of FIG. 1 in a third time interval $t_4$-$t_5$.

In FIG. 7 the dashed line 71' in the time interval $t_4$-$t_5$ indicates the situation, where there is still plasma surrounding the target 8. By closing the switch 32 at time $t_3$ the PFPN circuit 30 becomes active to shorten the time in which the arc is burning. Any electrons near the target 8 are caught, causing a current flowing through the PFPN circuit 30 as indicated by arrows 83 in FIG. 10. Thereby, the plasma floating potential (potential to which the target 8 is charged due to the plasma alone) decreases and the arc cannot be self-sustained anymore. The diodes 31 and 45 act as selective switches: Since the currents 81 and 83 are in opposite directions, the current 83 will flow through the closed switch 32, as soon as the energy in the wires 3, 4 causing the current 81 is fed back to the power supply circuit 10.

At time $t_5$ the switch 32 is opened. $t_5$ is chosen such that the arc is unlikely to reoccur.

At time $t_6$, which may be shortly after $t_5$, the switch 25 is closed which has the effect that the power of the power supply circuit 10 is supplied again to the electrodes 5 and 6. At the same time, the current 82 circulating in the switch 22 will pass progressively through the plasma. The voltage U across the electrodes 5 and 6 goes back to a negative value, whereas the current I increases again (see time interval $t_6$-$t_7$ of curves 70 and 71 in FIG. 7).

Figure 11:
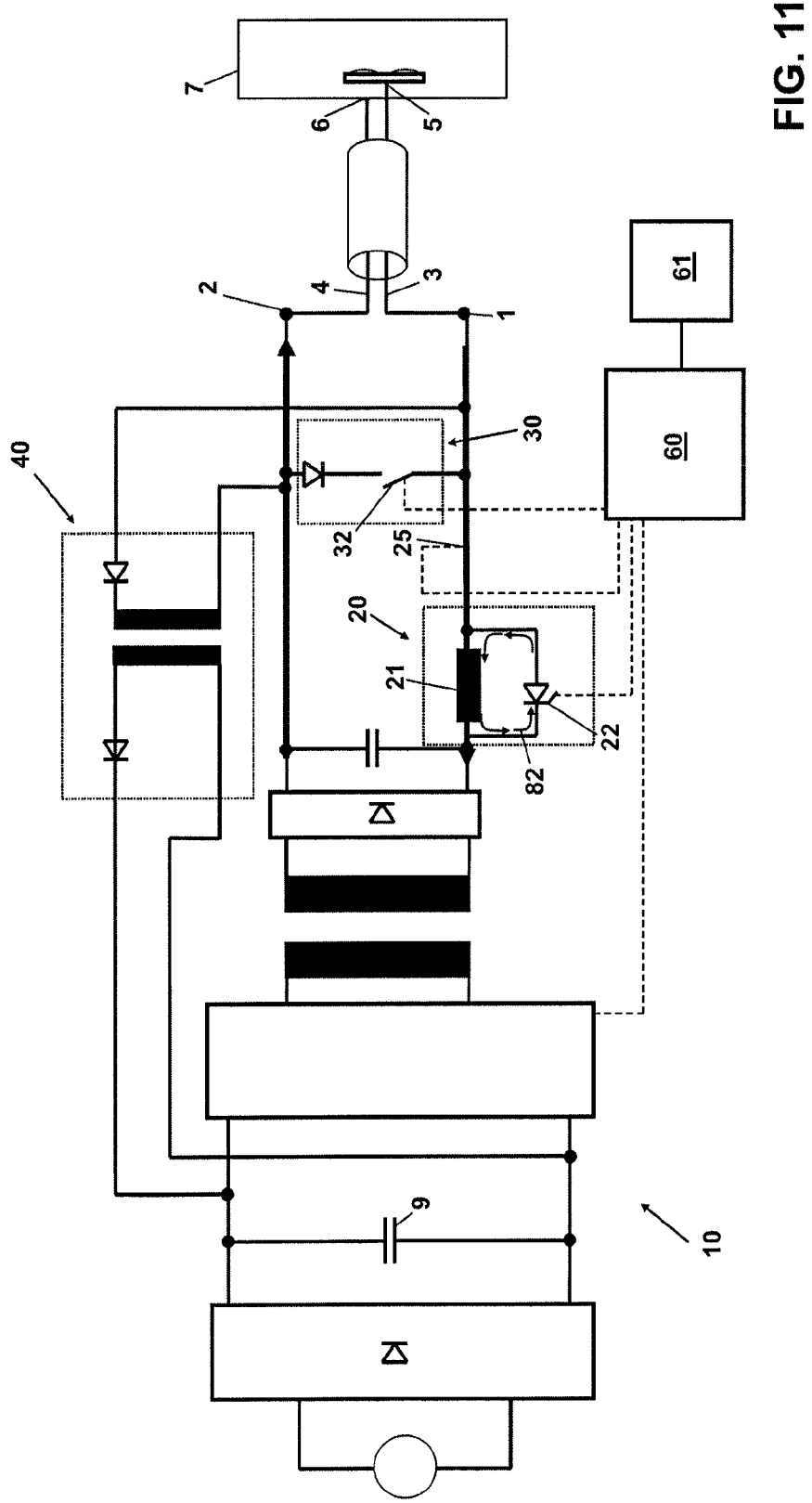
FIG. 11 shows schematically the state of the installation of FIG. 1 in a fourth time interval $t_7$-$t_9$.

At time $t_7$, the switch 22 is opened, such that the remaining current 82 flowing through the switch 22 is forced to flow into the plasma, which accelerates the process of recovering the plasma. The voltage U changes further by an amount of $U_{22}$, which is the voltage across the switch 22 at time $t_7$, whereas the current I increases further. If the switch 22 is a transistor which is apt to operated in the avalanche mode, it is possible to dissipate the energy of this residual current 82, such that not all of this energy has to be absorbed by the plasma. (See FIG. 11, in which the switch 22 is indicated by the inherent avalanche diode of the MOSFET.) The provision of switch 22 has the advantage that a runaway current can be prevented, i.e. a current which is accumulated during successive actuations of the switch 25 and which may have the effect that the arcs get more and more energy.

The switch 22 is actuated such that it is closed when the switch 25 is open, and open during a time interval which is long enough such that the current 82 flowing through the freewheeling diode 23 of the switch 22 has vanished.

At time $t_8$, the arc detection circuit 61 checks whether the conditions for an arc are still met. (This is not the case in the example shown in FIG. 7.).

At time $t_9$, the current flowing through the inductor 21 corresponds to the current I passing through the plasma and the switch 22 may be closed again.

At time $t_9$, the plasma processing is in the normal operation mode as it was at time $t_0$.

In the following an example of detecting and quenching an arc and its timing are discussed. The arc detection circuit 61 is designed such that it generates an arc detection signal when at least one of the following conditions is met (in the following denoted by "arc conditions"):

1. The current I in the plasma exceeds a certain value I1,
2. the absolute value of the voltage between the electrodes 5 and 6 (denoted by |U|) drops by a certain amount U0 while at the same time the current I in the plasma is above a certain minimum value I2,
3. the absolute value of the voltage |U| falls below a threshold U1 while at the same time the current I is above a certain minimum value I3.

In the present embodiment the minimum values I2 and I3 are set to be equal.

The controller 60 is adapted to receive various parameters for operating the power supply device which may be set by the user. Optionally, the controller 60 may be designed such that the operating parameters are variable in time by using a self-adaptive process to set one or more of the operating parameters during operation. The operating parameters comprises e.g. the voltage change U0 or the thresholds U1, I1 and I2 for arc detection, which are used by the arc detection circuit 61, and the various time intervals (delays) for controlling the switches 22, 25, 32 and the bridge circuit 13. Examples of such delay parameters are:

D1: time interval during which the power supply device tries to quench an arc before the bridge circuit 13 is switched off. Thus, D1 defines the number of times the switch 25 is, in an event of an arc, actuated before the power supply circuit 10 is switched off.

D2: time interval during which the bridge circuit 13 is switched off.

D3: time interval when the switch 25 is open. D3 corresponds to the interval $t_2$-$t_6$ in the example of FIG. 7.

D4: time interval during which the arc conditions are to be met before the switch 25 is opened. D4 corresponds to the interval $t_1$-$t_2$ in the example of FIG. 7.

D5: time interval between the closing of switch 25 and the checking step whether the plasma condition is met, i.e. whether the arc event is over. D5 corresponds to the interval $t_6$-$t_8$ in the example of FIG. 7.

As already mentioned above, the parameters may be variably set by a self-adaptive process. For example, the threshold U1 can be given by the average plasma voltage |U| plus a predefined valued. The delays D2 and D3 define the quenching time interval during which, in an event of an arc, no voltage is generated across the output terminals 1, 2.

The delay D3 may be set by means of the self-adaptive process such that D3 is increased if the plasma does not recover after one cycle of actuating the switches 22, 25, 32 to quench the arc.

Figure 12:
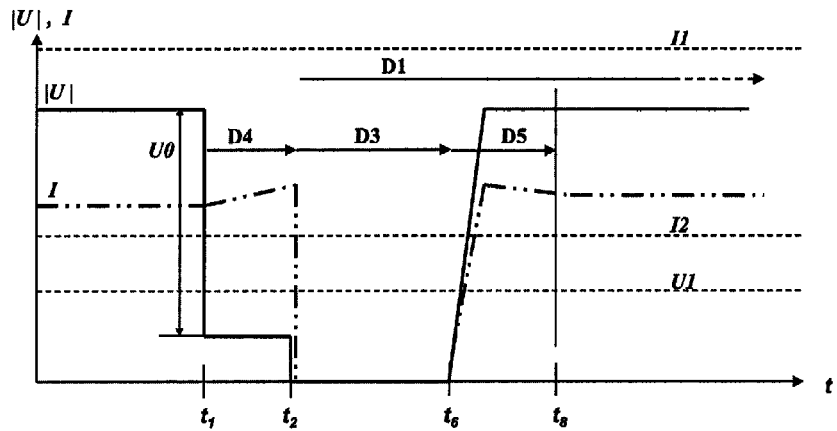
FIG. 12 shows a first example of the temporal development of |U| (absolute value of the voltage between the electrodes) and of I (current passing through the electrodes) for the case that the plasma recovers after one arc event only.

FIG. 12 shows a first example of the temporal development of |U| (solid curve) and I (dash-dotted curve). The example is similar to the example shown in FIG. 7. At time $t_8$, i.e. after one cycle of actuating the switches 22, 25, 32, the voltage |U| is greater than U1 and the current I is less than I1. The arc conditions are not met anymore. Thus, the plasma processing is in the normal operation mode again.

Figure 13:
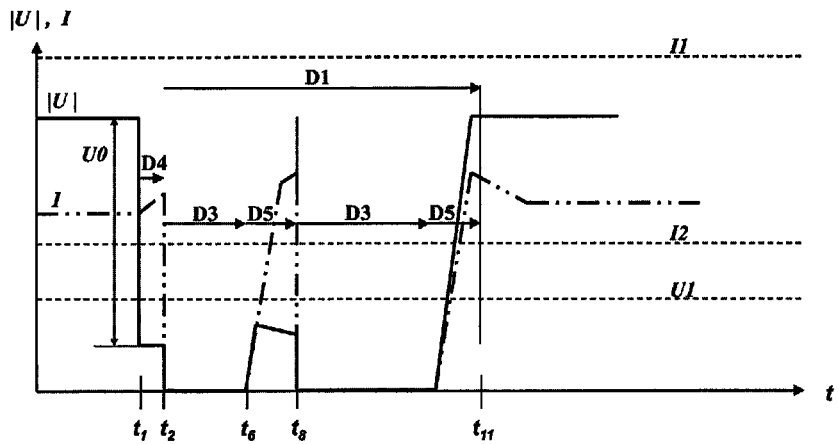
FIG. 13 shows a second example of the temporal development of |U| and of I.

FIG. 13 shows a second example of the temporal development of |U| (solid curve) and I (dash-dotted curve). In this example the delay D3 is set by means of a self-adaptive process. At time $t_8$, i.e. after one cycle of actuating the switches 22, 25, 32, the voltage |U| is still less than U1 and the current I is greater than I2. The arc conditions are still met. The delay D3 is increased. At time $t_{11}$, i.e. after the second cycle of actuating the switches 22, 25, 32, the arc conditions are not met anymore and the plasma processing changes to the normal operation mode.

Figure 14:
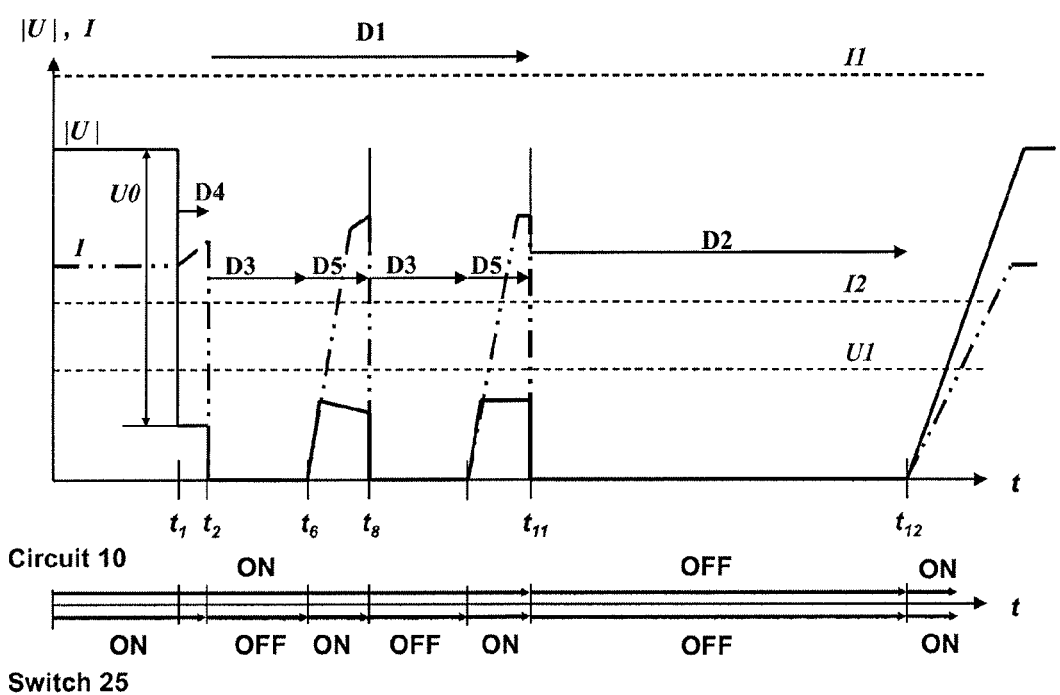
FIG. 14 shows a third example of the temporal development of |U| and of I as well as the corresponding switching states of the power supply circuit and the serial switch of the power supply device of FIG. 1.

FIG. 14 shows a third example of the temporal development of |U| (solid curve) and I (dash-dotted curve). In this example the arc conditions are still met at time $t_{11}$, i.e. after two cycles of actuating the switches 22, 25, 32. In this example the time interval D1 has expired, which means that there is no other try to quench the arc. The power supply circuit 10 is switched off by switching off the bridge circuit 13, such that no power is supplied to the terminals 16, 17 for the time delay D2. At time $t_{12}$ another cycle of actuating the switches 22, 25, 32 and the circuit 10 is started to re-ignite the plasma. The successive switching off and on of the power supply circuit 10 and the switch 25 is indicated in the lower diagram in FIG. 14.

The power supply device according to the invention is suitable for any plasma processing operation, such as sputtering, PECVD (Plasma Enhanced Chemical Vapour Deposition), etching, etc. The plasma processing operation may include usual materials as well as materials which are difficult to be processed such as zinc oxide (ZnO) or aluminum-doped zinc oxide (AZO).

The power supply device according to the invention has the advantage that when the power to the processing chamber is interrupted, less energy is involved in the arc occurrence. Thereby, the arc can be quenched quickly and the risk of damaging the target (and/or substrate when present) is reduced. In addition, it has been found that possible consecutive arcs are suppressed in an efficient way, such that the number of arc events is reduced.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power supply device for plasma processing, wherein electric arcs may occur, comprising
    a power supply circuit for generating a voltage across output terminals,
    said output terminals being for connection to a plasma processing chamber by means of conductors,
    an interrupting switch connected between said power supply circuit and one of said output terminals for interrupting the power supply to said plasma processing chamber in case of the occurrence of an arc, and
    a controller for controlling the power supply circuit and the first switch, such that, in an event of an arc, the first switch is opened and kept in the open state for a time interval to quench the arc and the power supply circuit is switched off in the event that the arc is still burning after actuating the first switch a number of times, said controller being configured to determine at least one delay parameter by means of a self-adaptive process, the delay parameter defining the time when, in an event of an arc, at least one of the power supply circuit and the first switch is switched on or switched off.

2. The power supply device according to claim 1, wherein said controller is configured to determine one or more of the following delay parameters by means of said self-adaptive process:

a first delay parameter defining the number of times N said interrupting switch is, in an event of an arc, actuated before said power supply circuit is switched off;

a second delay parameter defining the time during which said power supply circuit remains switched off, after said number N defined by said first delay parameter has been reached;

a third delay parameter defining the time during which said interrupting switch remains, in an event of an arc, in the open state;

a fourth delay parameter defining the time interval between the detection of an arc event and the opening of said interrupting switch;

a fifth delay parameter defining the time interval between the step of closing said interrupting switch after the time interval defined by said fourth delay parameter has lapsed and the step of checking of whether the arc is still burning.

3. The power supply device according to claim 1, further comprising an inductance circuit which is arranged between said power supply circuit and one of said output terminals and which comprises an inductor and a parallel switch connected parallel to said inductor.

4. The power supply device according claim 3, wherein said controller is configured to control said interrupting switch and said parallel switch of said inductance circuit such that, in the event of an arc, said parallel switch is in the closed state when said interrupting switch is in the open state and is opened after said interrupting switch is closed again.

5. The power supply device to claim 1, further comprising an arc detection circuit for detecting arc events in said plasma processing chamber, said arc detection circuit being configured to determine at least one of the following criteria defining an arc event:

the current I through electrodes, between which the plasma is generated, exceeds a given value $I1$, the absolute value of the voltage, $|U|$, across said electrodes drops by a given amount $U0$, while said current I is above a given minimum value $I2$, $|U|$ falls below a threshold $U1$ while said current I is above a given minimum value $I3$.

6. The power supply device according to claim 5, wherein said controller is configured to determine at least one of the parameters $U0$, $U1$, $I1$, $I2$, $I3$ by means of said self-adaptive process.

7. The power supply device according to claim 1, further comprising a floating potential neutralizing circuit connected to said output terminals for reducing the floating potential which is produced on at least one of a target and a substrate located in said plasma processing chamber after said interrupting switch is actuated to interrupt the power supply to said plasma processing chamber.

8. The power supply device according to claim 7, wherein said floating potential neutralizing circuit comprises another switch with a serial diode connected to said output terminals.

9. The power supply device according to claim 1, wherein said power supply circuit is designed to generate a continuous DC voltage or a pulsed DC voltage across said output terminals.

* * * * *